United States Patent
Hironiwa et al.

(10) Patent No.: US 10,619,261 B2
(45) Date of Patent: Apr. 14, 2020

(54) MANUFACTURING METHOD FOR ELECTRONIC COMPONENT

(71) Applicant: ULVAC, INC., Chigasaki-shi, Kanagawa (JP)

(72) Inventors: Daisuke Hironiwa, Chigasaki (JP); Takashi Kurimoto, Chigasaki (JP); Masahisa Ueda, Chigasaki (JP)

(73) Assignee: ULVAC, INC., Chigasaki-shi, Kanagawa (JP)

( * ) Notice: Subject to any disclaimer, the term of this patent is extended or adjusted under 35 U.S.C. 154(b) by 0 days.

(21) Appl. No.: 16/322,297

(22) PCT Filed: Mar. 22, 2018

(86) PCT No.: PCT/JP2018/011362
§ 371 (c)(1),
(2) Date: Jan. 31, 2019

(87) PCT Pub. No.: WO2018/180868
PCT Pub. Date: Oct. 4, 2018

(65) Prior Publication Data
US 2019/0177865 A1 Jun. 13, 2019

(30) Foreign Application Priority Data
Mar. 27, 2017 (JP) .................. 2017-060495

(51) Int. Cl.
*C25D 5/34* (2006.01)
*H01L 21/768* (2006.01)
(Continued)

(52) U.S. Cl.
CPC .................. *C25D 5/34* (2013.01); *C23F 4/00* (2013.01); *C25D 5/022* (2013.01); *C25D 7/12* (2013.01);
(Continued)

(58) Field of Classification Search
None
See application file for complete search history.

(56) References Cited

U.S. PATENT DOCUMENTS

| | | | |
|---|---|---|---|
| 2003/0102284 A1 | 6/2003 | Schmidt et al. | |
| 2013/0026044 A1 | 1/2013 | Yasuda et al. | |
| JP | H11-054460 | 2/1999 | |
| JP | 2002-212779 | 7/2002 | |
| JP | 2009-177152 | 8/2009 | |

(Continued)

FOREIGN PATENT DOCUMENTS

| | | |
|---|---|---|
| EP | 0 877 417 A1 | 4/1998 |
| JP | H04-196429 A | 7/1992 |

(Continued)

OTHER PUBLICATIONS

Office Action dated Jun. 10, 2019 in Taiwanese Application No. 107110471.

(Continued)

*Primary Examiner* — Asok K Sarkar
(74) *Attorney, Agent, or Firm* — Saliwanchik, Lloyd & Eisenschenk

(57) ABSTRACT

A manufacturing method for an electronic component according to an aspect of the present invention includes: forming a first metal layer on a substrate; forming a second metal layer on the first metal layer; forming a mask made of an organic resin layer on the second metal layer; performing plasma etching on the second metal layer by using a reactant gas including fluorine via the mask to thereby form a recess portion in a layered film of the organic resin layer and the second metal layer; performing oxygen ashing treatment on an inner surface of the recess portion; and forming a third metal layer in the recess portion by electroplating treatment after the oxygen ashing treatment.

4 Claims, 9 Drawing Sheets

(51) Int. Cl.
  *H01L 21/3065* (2006.01)
  *H01L 23/538* (2006.01)
  *H01L 21/3205* (2006.01)
  *H01L 23/522* (2006.01)
  *C23F 4/00* (2006.01)
  *C25D 7/12* (2006.01)
  *C25D 5/02* (2006.01)
  *H01L 23/532* (2006.01)

(52) U.S. Cl.
  CPC ...... *H01L 21/3065* (2013.01); *H01L 21/3205* (2013.01); *H01L 21/768* (2013.01); *H01L 21/76802* (2013.01); *H01L 21/76826* (2013.01); *H01L 21/76873* (2013.01); *H01L 21/76879* (2013.01); *H01L 23/522* (2013.01); *H01L 23/5384* (2013.01); *H01L 23/53238* (2013.01)

(56) References Cited

U.S. PATENT DOCUMENTS

2014/0329382 A1    11/2014   Hwang et al.
2019/0148167 A1*   5/2019    Kim .................. H01L 21/32139
                                                        252/79

FOREIGN PATENT DOCUMENTS

JP    2013-047786 A    3/2013
JP    2014-220485 A    11/2014

OTHER PUBLICATIONS

International Search Report in International Application No. PCT/JP2018/011362, filed Mar. 22, 2018.

* cited by examiner

MANUFACTURING METHOD FOR ELECTRONIC COMPONENT

CROSS-REFERENCE TO RELATED APPLICATIONS

This application is the U.S. national stage application of International Patent Application No. PCT/JP2018/011362, filed Mar. 22, 2018, which claims the benefit under 35 U.S.C. § 119 of Japanese Application No. 2017-060495, filed Mar. 27, 2017, the disclosures of each of which are incorporated herein by reference in their entirety.

TECHNICAL FIELD

The present invention relates to a manufacturing method for an electronic component including a metal layer, which uses electroplating treatment.

BACKGROUND ART

In recent years, there has been proposed manufacture of a package (electronic component) called fan out wafer level package (FOWLP) in which a re-distribution layer is formed instead of a wiring board. In the manufacture of the FOWLP, a semiconductor chip is sealed with a sealing resin. Then, a circuit forming surface of a semiconductor chip is exposed. A re-distribution layer is formed on that circuit forming surface (re-distribution forming step). In this manner, a re-distribution region is widely ensured.

The re-distribution layer is configured by stacking wiring layers while sandwiching an interlayer insulating film therebetween. The different wiring layers are electrically connected through copper via-holes provided in the interlayer insulating film. For example, copper via-holes or copper wires are formed by forming a photoresist pattern having via-holes or trenches on a metal layer and embedding copper in the via-holes or trenches by electroplating treatment (e.g., see Patent Literatures 1 and 2). The photoresist pattern having the via-holes or trenches is formed by exposing and developing a photoresist by using photolithography to thereby provide the via-holes or trenches in the photoresist.

In the past, via-holes are formed in a photoresist by a wet process using a developer. However, there is a demand for forming via-holes by a dry process. For example, at a step of forming copper via-holes, a copper layer, a titanium layer, and a mask including an organic resin layer are sequentially formed on a semiconductor substrate. Then, the titanium layer is subjected to plasma etching using a reactant gas including fluorine via the mask. In this manner, via-holes penetrating a layered film of the titanium layer and the organic resin layer are formed. Thereafter, copper is embedded in the via-holes by performing electroplating treatment. The copper via-holes are thus formed.

When the via-holes are formed by plasma etching using the reactant gas including fluorine, the surface of the organic resin layer (mask) is fluorinated and the fluoride is formed on the surface. When the surface of the organic resin layer is fluorinated, the surface of the organic resin layer exhibits hydrophobicity. It is thus difficult to cause an electroplating solution to enter the via-holes in subsequent electroplating treatment. It is difficult to obtain copper via-holes each having a desired shape. There is a fear that a wiring defect may occur.

CITATION LIST

Patent Literature

Patent Literature 1: Japanese Patent Application Laid-open No. 2013-47786
Patent Literature 2: Japanese Patent Application Laid-open No. 2014-220485

DISCLOSURE OF INVENTION

Technical Problem

In view of the above-mentioned circumstances, it is an object of the present invention to provide a manufacturing method for an electronic component, which includes an electroplating treatment step in which an electroplating solution favorably enters a hole provided in an organic resin layer.

Solution to Problem

In order to accomplish the above-mentioned object, a manufacturing method for an electronic component according to an aspect of the present invention includes forming a first metal layer, forming a second metal layer, forming a mask, performing etching, performing oxygen ashing treatment, and forming a third metal layer.

The step of forming the first metal layer includes forming a first metal layer on a substrate.

The step of forming the second metal layer includes forming a second metal layer on the first metal layer.

The step of forming the mask includes forming a mask made of an organic resin layer on the second metal layer.

The etching step includes performing plasma etching on the second metal layer by using a reactant gas including fluorine via the mask to thereby form a recess portion in a layered film of the organic resin layer and the second metal layer.

The oxygen ashing step includes performing oxygen ashing treatment on an inner surface of the recess portion.

The step of forming the third metal layer includes forming a third metal layer in the recess portion by electroplating treatment after the oxygen ashing treatment.

In accordance with such a configuration of the present invention, the surface of the organic resin layer, which becomes hydrophobic due to etching using the gas including fluorine, is subjected to hydrophilization treatment by oxygen ashing. Therefore, the organic resin layer surface inside the recess portion is subjected to hydrophilization treatment, and thus the electroplating solution easily enters the recess portion while the third metal layer is formed. The third metal layer in a desired shape can be thus formed. With this, an electronic component having no wiring defect can be manufactured.

The fourth metal layer may include titanium.

The etching step may be performed by using a mixed gas of oxygen, nitrogen, and tetrafluoromethane as the reactant gas.

The oxygen ashing treatment step may be performed by using oxygen plasma mainly including an oxygen radical.

With such a configuration, the hydrophilization effect of the surface of the organic resin layer by oxygen ashing can be maintained for long time, and an electronic component having no wiring defect can be stably obtained.

Advantageous Effects of Invention

As described above, in accordance with the present invention, an electroplating solution can favorably enter a hole by performing hydrophilization treatment on an organic resin layer, and an electronic component having no wiring defect can be provided.

MODE(S) FOR CARRYING OUT THE INVENTION

Hereinafter, an embodiment of the present invention will be described with reference to the drawings. Hereinafter, some of re-distribution layer steps for an electronic component formed by re-arranging a plurality of semiconductor elements each made in a chip form on a wafer, covering those semiconductor elements with a mold resin, and forming a re-distribution layer that electrically connects the semiconductors to one another on the mold resin will be described as an example, though not limited thereto.

Hereinafter, one obtained by covering the semiconductor elements arranged on the wafer with the mold resin will be referred to as a semiconductor substrate and will be described.

A manufacturing step for an electronic component in this embodiment includes an etching treatment step and an oxygen ashing treatment step. A manufacturing device in which those treatment steps are performed will be described below.

[Configuration of Manufacturing Device]

Figure 4:
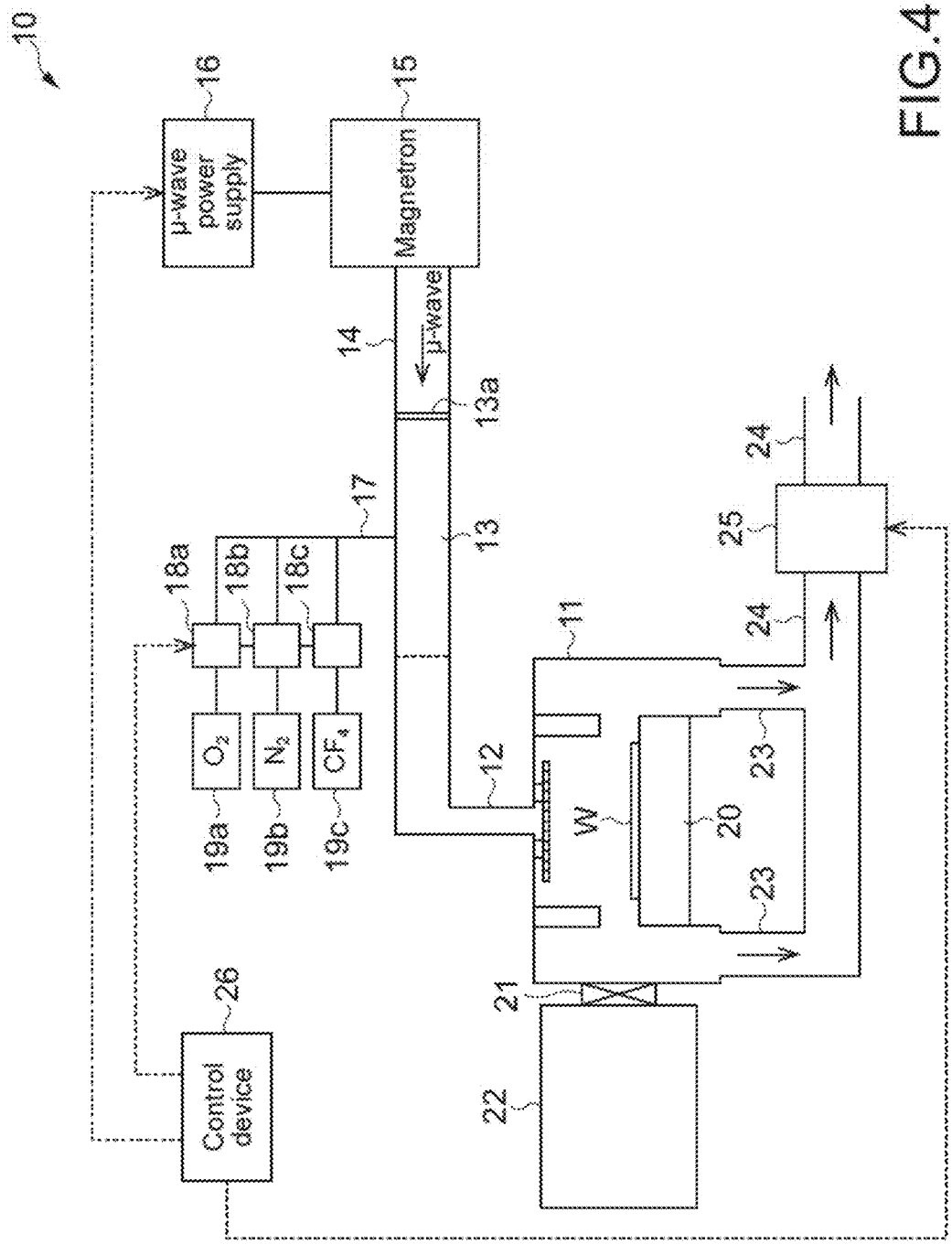
FIG. 4 A schematic configuration diagram of a manufacturing device that performs etching and ashing on the electronic component.
Figure 5:
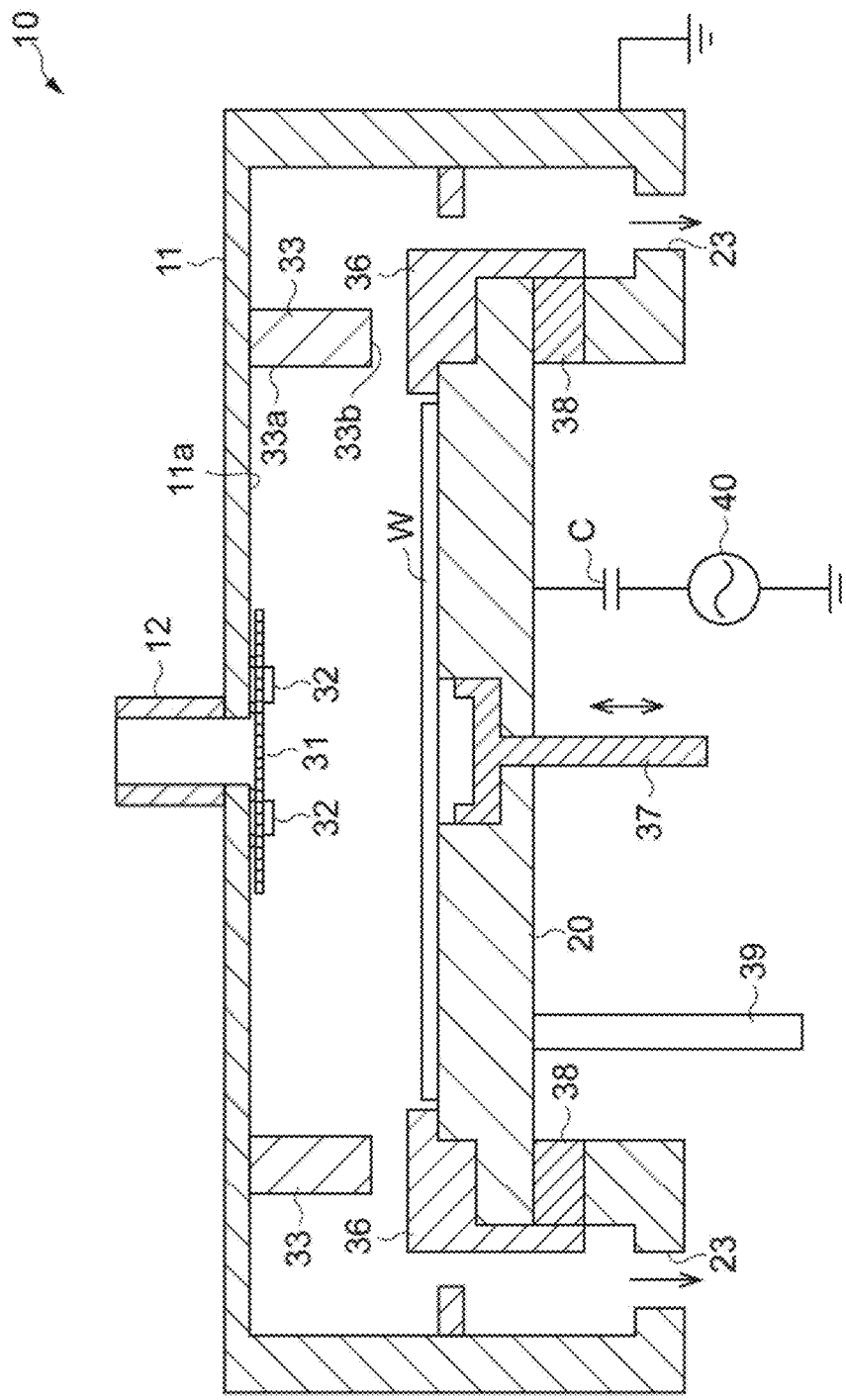
FIG. 5 A schematic cross-sectional view of a chamber of the manufacturing device.

FIG. 4 is a schematic configuration diagram of the manufacturing device. FIG. 5 is a schematic cross-sectional view of a chamber of the manufacturing device. The manufacturing device in this embodiment is configured to be capable of performing etching treatment and ashing treatment.

As shown in FIG. 4, a manufacturing device 10 includes a chamber (process chamber) 11, a plasma chamber 13, a transport pipe 12, a magnetron 15, a p-wave power supply 16, a gas introduction pipe 17, mass flow controllers 18a to 18c, gas supply sources 19a to 19c, a load-lock chamber 22, a control device 26, an exhaust pipe 24, and a pressure controller 25.

The chamber 11 houses a semiconductor substrate W such as a wafer that is a target object to be processed. The semiconductor substrate W is subjected to etching treatment and ashing treatment in the chamber 11. A substrate stage 20 is arranged inside the chamber 11. The substrate W is placed on the substrate stage 20. The load-lock chamber 22 is connected to the chamber 11 via a gate 21.

An exhaust pipe 23 is formed at the bottom of the chamber 11. The exhaust pipe 23 is connected to an exhaust pump (not shown) via the exhaust pipe 24. The exhaust pump reduces the pressure inside the chamber 11. The exhaust pipe 24 is provided with the pressure controller 25. The pressure controller 25 controls the pressure inside the chamber 11.

An upper portion of the chamber 11 is connected to the plasma chamber 13 via the transport pipe 12. The plasma chamber 13 is connected to the magnetron 15 via a microwave guide tube 14. The plasma chamber 13 and the microwave guide tube 14 are partitioned with a microwave transmission window 13a made of quartz and the like. The microwave guide source 16 is connected to the magnetron 15. Microwaves (μ-waves) generated at the magnetron 15 are guided into the plasma chamber 13 through the microwave guide tube 14.

The plasma chamber 13 is connected to the plurality of (in this embodiment, three) mass flow controllers 18a to 18c via the gas introduction pipe 17. Each of the mass flow controllers 18a to 18c is connected to each gas supply source. In this embodiment, the gas supply source 19a stores oxygen ($O_2$), the gas supply source 19b stores nitrogen ($N_2$), and the gas supply source 19c stores tetrafluoromethane ($CF_4$). The flow rate of the gases stored in the respective gas supply sources 19a to 19c are controlled by the mass flow controllers 18a to 18c. A reactant gas that is a mixture of oxygen, nitrogen, and tetrafluoromethane at a predetermined flow rate is introduced into the plasma chamber 13 through the gas introduction pipe 17.

Plasma is generated in the plasma chamber 13 due to the microwaves and the reactant gas. Radicals as active species in that plasma are guided into the chamber 11 through the transport pipe 12.

The microwave power supply 16, the respective mass flow controllers 18a to 18c, and the pressure controller 25 are connected to the control device 26. The control device 26 includes a storage device (not shown). The storage device stores information about conditions for processing various substrates. On the basis of treatment condition information depending on the substrate W to be carried into the chamber 11, the control device 26 controls the microwave power supply 16, the respective mass flow controllers 18a to 18c, and the pressure controller 25.

Next, a configuration of the chamber 11 will be described with reference to FIG. 5.

At a lower end of the transport pipe 12 coupled to the upper portion of the chamber 11, a shower plate (diffuser) 31 formed in a disk shape and having many through-holes is arranged to face a placing surface of the substrate stage 20 on which the semiconductor substrate W is placed. The shower plate 31 is fixed to the upper portion of the chamber 11 and is arranged spaced apart from an upper inner surface 11a by a predetermined distance due to supports provided in the shower plate. The distance between the upper inner surface 11a of the chamber 11 and the shower plate 31 is set such that oxygen radicals introduced into the chamber 11 through the transport pipe 12 passes through the through-hole formed in the shower plate 31, passes between the shower plate 31 and the upper portion of the chamber 11, and is guided to a periphery.

An upper end of a diffusion-inhibiting wall 33 formed in a cylindrical shape is attached to the upper inner surface 11a of the chamber 11. The shower plate 31 is surrounded by the diffusion-inhibiting wall 33. The diffusion-inhibiting wall 33 is set to have an inner diameter slightly larger than an outer diameter of the substrate W to be placed on the substrate stage 20.

A peripheral upper portion of the substrate stage 20 is covered with the substrate guide 36. An end of a lift pin 37 supported to be movable in upper and lower directions is provided inside the substrate stage 20. By moving the lift pin 37 in the upper and lower directions, the semiconductor substrate W between the lift pin 37 and a conveyance device (not shown) is placed on the substrate stage 20.

An insulation plate 38 is interposed between the substrate stage 20 and a lower portion of the chamber 11. Further, piping 39 is connected to the substrate stage 20. Cooling water is supplied into a water channel (not shown) formed inside the substrate stage 20 through the piping 39, such that temperature control on the substrate stage 20 is performed. Furthermore, a radio-frequency power supply 40 is connected to the substrate stage 20 via a capacitor C, and the radio-frequency power supply 40 supplies the substrate stage 20 with radio-frequency bias (RF bias).

On the other hand, the chamber 11 is grounded and becomes an electrode electrically opposite to that of the radio-frequency bias supplied to the substrate stage 20 from the radio-frequency power supply 40. Then, a first layer of the shower plate 31 is electrically connected to the chamber 11 via mounting members 32 and the diffusion-inhibiting wall 33 is also electrically connected thereto.

[Manufacturing Method for Electronic Component]

Next, a manufacturing method for an electronic component using the above-mentioned manufacturing device will be described.

In this embodiment, a copper-via-hole forming step which is a part of a step of forming a re-distribution layer of an electronic component obtained by forming the re-distribution layer on a circuit forming surface of a semiconductor chip covered with a sealing resin will be described as an example.

Figure 2A:
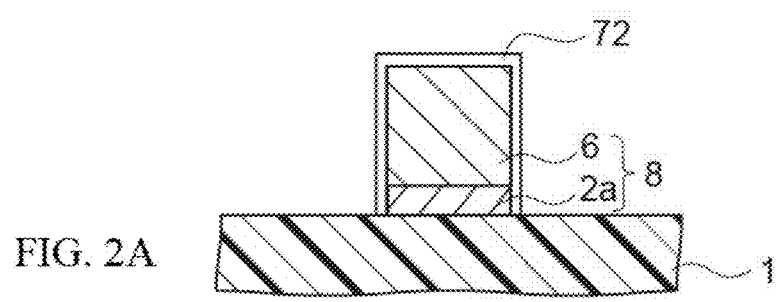
FIGS. 2A-2B A schematic partial cross-sectional view showing a manufacturing step (Part II) for an electronic component, which is subsequent to the manufacturing step shown in FIGS. 1A-1E.
Figure 2B:
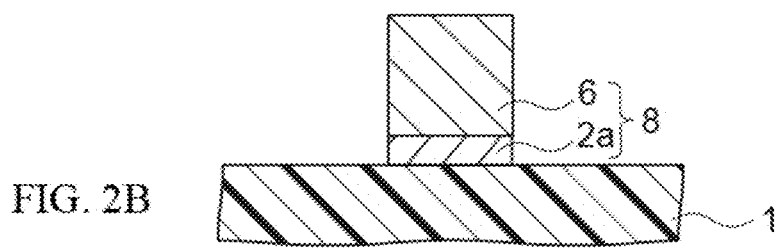
Figure 3:
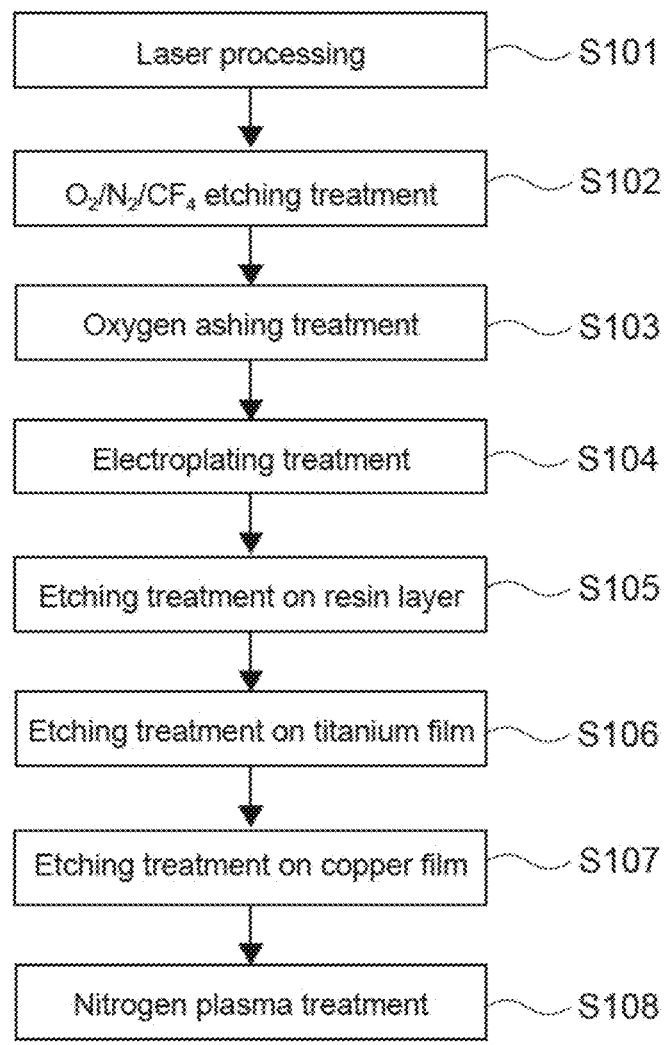
FIG. 3 A flowchart for manufacturing the electronic component.

Hereinafter, descriptions will be given with reference to FIGS. 1 to 5. FIGS. 1 and 2 are schematic partial cross-sectional views each showing a manufacturing step for the electronic component. FIG. 3 is a flowchart for manufacturing the electronic component.

Figure 1A:
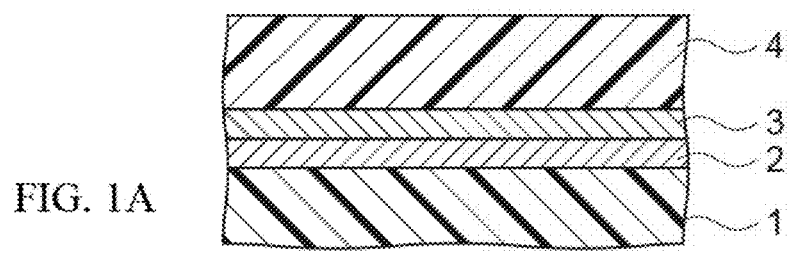
FIGS. 1A-1E A schematic partial cross-sectional view showing a manufacturing step (Part I) for an electronic component according to an embodiment of the present invention.

First of all, as shown in FIG. 1A, a copper layer 2 as a first metal layer having a film thickness of 100 nm and a titanium layer 3 as a second metal layer having a film thickness of 50 nm are sequentially stacked on the circuit forming surface of the semiconductor chip (hereinafter, referred to as a semiconductor substrate) 1 sealed with the sealing resin by a sputtering film-forming method, for example. In addition, an organic resin layer 4 having a film thickness of 6 μm is formed on the titanium layer 3. A thermally resistant organic resin such as polyimide (PI) and polybenzoxazole (PBO) can be used as the organic resin layer 4. In this embodiment, PBO was used.

The titanium layer 3 is arranged between the copper layer 2 and the organic resin layer 4 and functions as an adhesion layer for increasing the adhesion between both. It should be noted that the second metal layer formed between the copper layer 2 and the organic resin layer 4 is not limited to titanium, and an alloy of titanium and the like can be used. Those materials are materials which can be etched by plasma etching using a reactant gas including fluorine. Further, the first metal layer which functions as a negative pole in electroplating treatment at the subsequent step is not limited to copper, and silver and the like can be used.

Figure 1B:
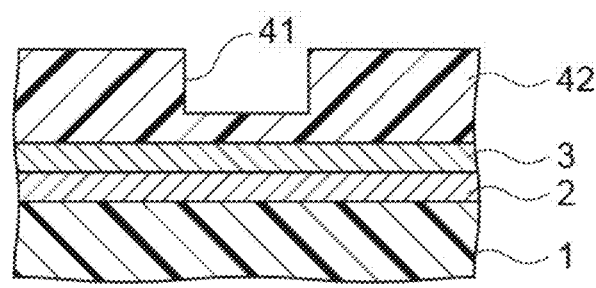

Next, as shown in FIG. 1B, the organic resin layer 4 which is a portion corresponding to a region in which a copper via-hole is to be formed at the subsequent step is removed by laser (S101). A mask 42 made of an organic resin layer which includes a first recess portion 41 which is to be a part of the via-hole is thus formed. The first recess portion 41 does not penetrate the organic resin layer, and the organic resin layer having a thickness of 500 nm remains such that the titanium layer 3 which is a layer beneath the mask 42 is not exposed in a region in which the copper via-hole of the mask 42 is to be formed.

In this manner, the mask 42 is formed by removing a part of the organic resin layer by laser such that only the region in which the copper via-hole is to be formed has a thickness smaller than that of another region. With this, control can be achieved such that, at the subsequent etching step, the copper layer 2 is exposed only in the region in which the copper via-hole is to be formed and the organic resin layer remains in the other region. Further, leaving the part of the organic resin layer such that the titanium layer 3 is not exposed in the region in which the copper via-hole of the mask 42 is to be formed is for inhibiting the copper layer 2 which is a layer beneath the titanium layer 3 from being damaged by laser in the laser processing due to the small thickness of the titanium layer 3.

Next, the semiconductor substrate 1 is carried into the chamber 11 of the manufacturing device, and the semiconductor substrate 1 is placed on the substrate stage 20 while upwardly facing a surface (processing surface) on which an organic resin layer 42 is to be formed. Next, the pressure inside the chamber 11 is reduced, and the radio-frequency bias (RF bias) is applied on the substrate stage 20. On the other hand, the plasma chamber 13 is supplied with the gases of oxygen ($O_2$), nitrogen ($N_2$), and tetrafluoromethane ($CF_4$) from the respective gas supply sources 19a to 19c and is further supplied with microwaves generated at the magnetron 15 through the microwave guide tube 14. In the plasma chamber 13, plasma is generated due to the microwaves and the mixed gas (reactant gas) of $O_2/N_2/CF_4$, and oxygen radicals and CF radicals as active species in that plasma are guided into the chamber 11 through the transport pipe 12.

Figure 1C:
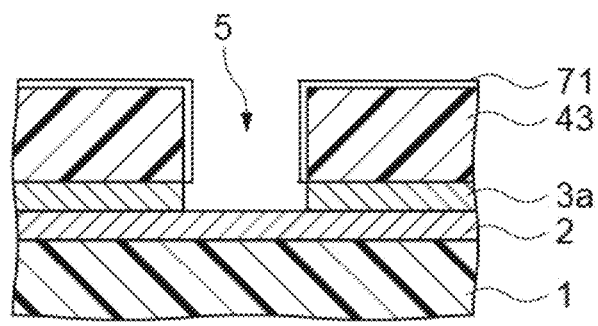

By guiding oxygen radicals and CF radicals into the chamber 11, as shown in FIG. 1C, the organic resin layer of the mask 42, which corresponds to the first recess portion 41, is removed by ashing with oxygen radicals via the mask 42, and the titanium layer 3 is further removed by etching with CF radicals (S102). With this, in the layered film of the organic resin layer and the titanium layer 3 which constitute the mask 42, there is formed a via-hole 5 as a second recess portion penetrating that layered film in a thickness direction thereof.

At the etching treatment step, the organic resin layer of the region, which corresponds to the first recess portion 41 of the mask 42, is removed, and a mask 43 in which a through-hole constituting the part of the via-hole 5 is formed is formed. Further, a titanium layer 3a in which a through-hole constituting another part of the via-hole 5 is formed is formed.

It should be noted that the organic resin layer in a region in which the first recess portion 41 of the mask 42 is not formed is removed in that etching treatment, the film thickness of the organic resin layer 4 is set as appropriate in view of an etching amount in that etching treatment using the mixed gas.

The etching treatment (S102) using the mixed gas of $O_2/N_2/CF_4$ was performed by setting the temperature of the substrate stage 20 to 25° C., setting the flow rate of $O_2$, $N_2$, and $CF_4$ to 100 sccm, 100 sccm, and 300 sccm, respectively, setting the pressure inside of the chamber 11 to 35 Pa, setting the microwave electric power to 1500 W, setting the RF bias to 300 W, and setting the treatment time to 30 seconds.

Regarding the temperature of the substrate stage 20, treatment at 150° C. or less is desirable, and treatment at the temperature of 15 to 150° C. is more desirable for maintaining the quality of the chip formed in the semiconductor substrate 1. If the treatment temperature is above 150° C., it leads to deterioration of the electronic chip and to a change in quality of the organic resin film.

Further, the etching rate of the titanium layer 3 can be increased by increasing the ratio of $CF_4$ in the mixed gas. Further, the life-time of $O_2$ radicals can be prolonged by providing $N_2$ in the mixed gas.

Fluoride 71 is formed on the surface of the organic resin layer constituting the mask 43 due to $CF_4$ which is a gas including fluorine of the mixed gas in the etching treatment. With this fluoride, the surface of the organic resin layer constituting the mask 43 exhibits hydrophobicity.

Next, the application of the radio-frequency bias (RF bias) on the substrate stage 20 is stopped under a state in which the semiconductor substrate 1 is placed inside the same chamber 11. On the other hand, the plasma chamber 13 is supplied with oxygen ($O_2$) from the gas supply source 19a and is further supplied with microwaves generated at the magnetron 15 through the microwave guide tube 14. In the plasma chamber 13, oxygen plasma is generated due to the microwaves and $O_2$ and oxygen radicals as active species in that oxygen plasma are guided into the chamber 11 through the transport pipe 12.

Figure 1D:
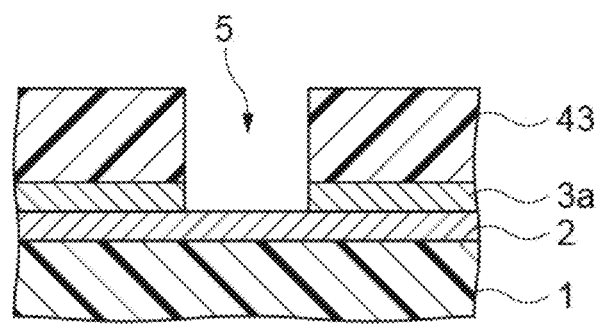

By guiding oxygen radicals into the chamber 11, the surface of the organic resin layer is subjected to oxygen ashing treatment and the fluoride 71 formed on the surface is removed as shown in FIG. 1D (S103). With this oxygen ashing treatment, the surface of the organic resin layer constituting the mask 43, which includes an inner surface of the via-hole 5, is hydrophilized and exhibits hydrophilicity.

The oxygen ashing treatment was performed under a treatment condition that the temperature of the substrate stage 20 was 25° C., the flow rate of $O_2$ was 1600 sccm, the pressure inside the chamber 11 was 70 Pa, the microwave electric power was 500 W, and the treatment time was 3 seconds.

Regarding the temperature of the substrate stage 20, treatment at 150° C. or less is desirable and treatment at the temperature of 15 to 150° C. is desirable for maintaining the quality of the chip formed in the semiconductor substrate 1

Figure 1E:
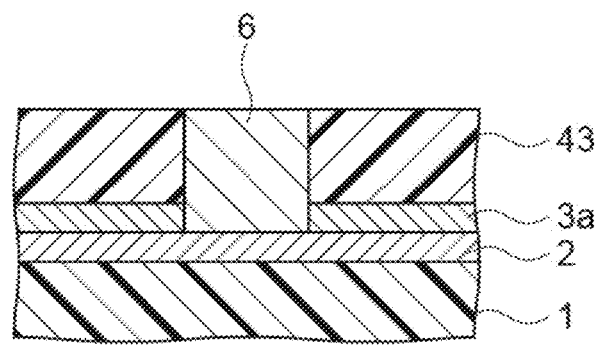

Next, after the semiconductor substrate 1 is carried out from the chamber 11 of the manufacturing device, the semiconductor substrate 1 is carried into an electroplating device, and the copper-via-hole formation using the electroplating treatment is performed on the semiconductor substrate 1 at that device (S104). That is, after the semiconductor substrate 1 and a copper source are immersed in an electroplating solution, DC current is supplied from an external power supply such that the copper layer 2 formed in the semiconductor substrate 1 becomes a negative pole and the copper source becomes a positive pole. With this, as shown in FIG. 1E, copper ions dissolved from the copper source are reduced on the copper layer 2, such that copper is formed in the via-hole 5. A copper layer 6 for the via-hole is thus formed as a third metal layer which becomes a part of the copper via-hole.

At the electroplating treatment step, the surface of the organic resin layer 43 exhibits hydrophilicity due to the quality change processing in the oxygen ashing treatment, and thus the electroplating solution can favorably enter the via-hole 5.

Here, an effect of hydrophilization by the oxygen ashing treatment will be described.

The contact angle when the electroplating solution adhered to the surface of the organic resin layer of the mask 42 on the semiconductor substrate 1 before the etching treatment (S102) using the mixed gas of $O_2/N_2/CF_4$ after the laser processing (S101) was 82.50.

The contact angle when the electroplating solution adhered to the surface of the organic resin layer of the mask 43 of the semiconductor substrate 1 before the oxygen ashing treatment (S103) after the etching treatment (S102) using the mixed gas of $O_2/N_2/CF_4$ was about 1000.

The contact angle when the electroplating solution adhered to the surface of the organic resin layer of the mask 43 of the semiconductor substrate 1 after the etching treatment (S102) using the mixed gas of $O_2/N_2/CF_4$ and the oxygen ashing treatment (S103) was about 5°.

As described above, it was confirmed that the surface of the organic resin layer exhibiting hydrophobicity after the fluoride was formed on the surface in the etching treatment using the mixed gas of $O_2/N_2/CF_4$ was subjected to hydrophilization treatment and exhibited hydrophilicity by being subjected to oxygen ashing treatment.

Figure 6:
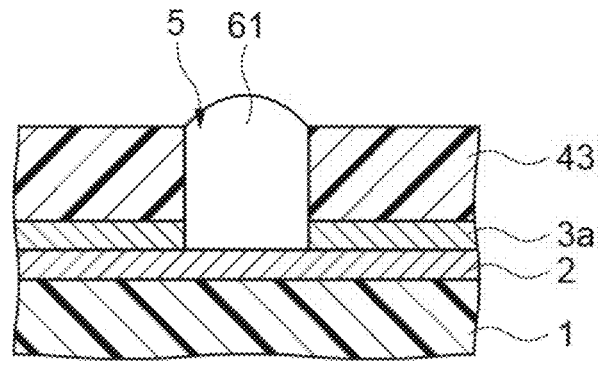
FIG. 6 A schematic partial cross-sectional view showing a state of an electroplating treatment step for the electronic component.
Figure 7A:
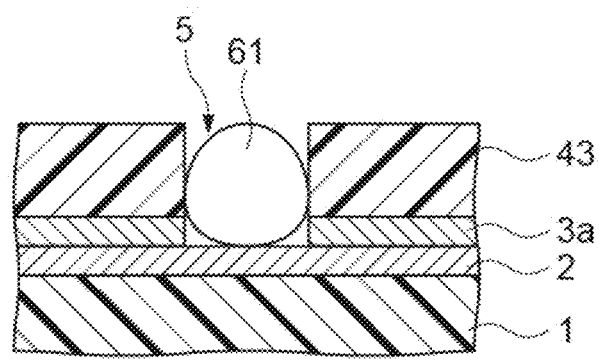
FIGS. 7A-7B A schematic partial cross-sectional view showing a state of an electroplating treatment step for an electronic component not subjected to oxygen ashing treatment.
Figure 7B:
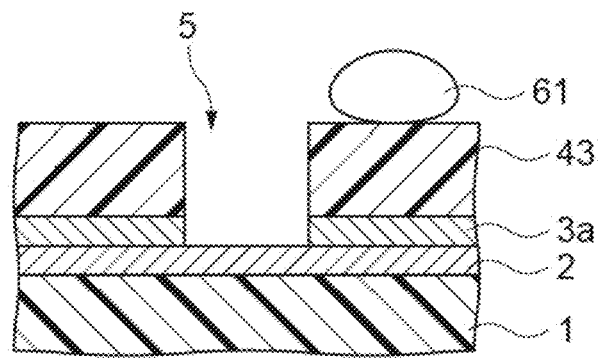

FIG. 6 is a diagram schematically showing a state in which an electroplating solution 61 enters the via-hole 5 when the semiconductor substrate 1 subjected to oxygen ashing treatment is immersed in the electroplating solution. FIGS. 7A-7B are diagrams schematically showing a state in which the semiconductor substrate 1 not subjected to oxygen ashing treatment is immersed in the electroplating solution 61.

In the semiconductor substrate 1 not subjected to oxygen ashing treatment, the surface of the mask 43 exhibits hydrophobicity. Therefore, as shown in FIGS. 7A-7B, when the substrate 1 is immersed in the electroplating solution, the electroplating solution 61 is repelled on the surface of the mask 43 of the organic resin layer and the electroplating solution 61 cannot favorably enter the via-hole 5 in some cases. In addition, even if the electroplating solution 61 enters the via-hole 5, the electroplating solution 61 does not completely extend over the via-hole 5 and a gap is formed in some cases. When the electroplating treatment is performed under such a state, a copper layer for the via-hole in a desired shape cannot be obtained. In some cases, the copper layer for the via-hole is not formed and the resulting electronic component causes a wiring defect.

In contrast, as shown in FIG. 6, with the semiconductor substrate 1 including the mask 43 exhibiting hydrophilicity, whose surface has been changed in quality by the oxygen ashing treatment, the electroplating solution 61 is not repelled on the surface of the mask 43 of the organic resin layer and no gaps are formed in the via-hole 5. The electroplating solution 61 favorably enters the via-hole 5 and an excellent copper-embedding property is provided. Therefore, the copper layer for the via-hole in a desired shape can be obtained and an electronic component having no wiring defect can be obtained.

Next, the semiconductor substrate 1 subjected to electroplating treatment is carried out from the electroplating device and the mask 43 is removed by well-known wet etching or dry etching (S105).

Next, the semiconductor substrate 1 is carried into an etching device. Then, the titanium layer 3a and the copper layer 2 of the copper layer 2, which excludes the region in which the copper layer 6 for the via-hole is formed, are sequentially removed by etching. Specifically, the titanium layer 3 is removed by plasma etching treatment using a mixed gas of oxygen-, nitrogen-, fluorine-based gases (S106). Thereafter, the copper layer 2 excluding the region in which the copper layer 6 for the via-hole is formed is removed by performing well-known wet etching on the copper layer 2 (S107). With this, as shown in FIG. 2A, a copper via-hole 8 is formed. The copper via-hole 8 is made of a stack of a copper layer 2a remaining in the region in which the copper layer 6 for the via-hole is formed and the copper layer 6 for the via-hole. The reactant gas including oxygen and fluorine is used at the etching step of the titanium layer 3. Therefore, oxide-and-fluoride 72 are formed on the surface of the copper via-hole 8.

The etching step of the titanium layer 3 was performed under a treatment condition that the temperature of the substrate stage was 25° C., the flow rate of $O_2$, $N_2$, $CF_4$ was 100 sccm, 100 sccm, and 300 sccm, the pressure inside the chamber 11 was 35 Pa, the microwave electric power was 1500 W, the RF bias was 300 W, and the treatment time was 30 seconds.

Next, the semiconductor substrate 1 in which the copper via-hole 8 is formed is subjected to nitrogen plasma treatment (S107). With this, the oxide-and-fluoride 72 formed on the surface of the copper via-hole 8 are removed. The nitrogen plasma treatment was performed by setting the temperature of the substrate stage to 50° C., setting the flow rate of $N_2$ to 1000 sccm, setting the pressure inside the chamber 11 to 100 Pa, setting the microwave electric power to 0 W, setting the RF bias to 300 W, and setting the treatment time to 30 seconds.

Here, in a case where the semiconductor substrate 1 was not subjected to nitrogen plasma treatment (S107), oxygen and fluorine as well as copper were present in a region from the surface of the copper via-hole 8 to a depth of 6 nm. In contrast, in the case where the semiconductor substrate 1 was subjected to nitrogen plasma treatment, only copper was present at a depth of 3 nm or more from the surface of the copper via-hole 8 and oxygen and fluorine present in a region from the surface of the copper via-hole 8 to a depth of 3 nm were also greatly reduced as compared to the substrate not subjected to nitrogen plasma treatment.

As described above, in the semiconductor substrate 1 subjected to nitrogen plasma treatment, oxidation of copper is suppressed and oxidized copper having a high specific electrical resistance is inhibited from being generated on the surface of the copper via-hole 8. Therefore, an electronic component having favorable electrical characteristics can be obtained.

In the above-mentioned manner, the copper via-hole 8 is formed.

As described above, by performing oxygen ashing treatment after the etching treatment using the gas including fluorine, the surface of the organic resin layer formed in the semiconductor substrate 1 can be subjected to hydrophilization treatment. With this, the electroplating solution can favorably enter the via-hole while the copper layer for the via-hole is formed in the electroplating treatment at the subsequent step. Therefore, the electroplating solution enters without forming gaps in the via-hole, the via-hole formed of the copper layer can be formed in a desired shape and an electronic component having no wiring defect can be obtained.

Further, by performing nitrogen plasma treatment on the semiconductor substrate 1 in which the copper via-hole 8 is formed, oxidation of the surface of the copper via-hole can be suppressed.

In the above-mentioned embodiment, the oxygen ashing treatment is performed and the hydrophilization treatment of the organic resin layer is performed under the state in which the application of the RF bias is stopped. Alternatively, the effect of hydrophilization of the organic resin layer surface can also be obtained by performing oxygen ashing treatment under a state in which the RF bias is applied.

Next, a change of the organic resin layer surface due to the above-mentioned oxygen ashing treatment will be described.

FIGS. 8A-8D are X-ray photoelectron spectroscopy (XPS) analysis results of the organic resin layer surface.

Figure 8A:
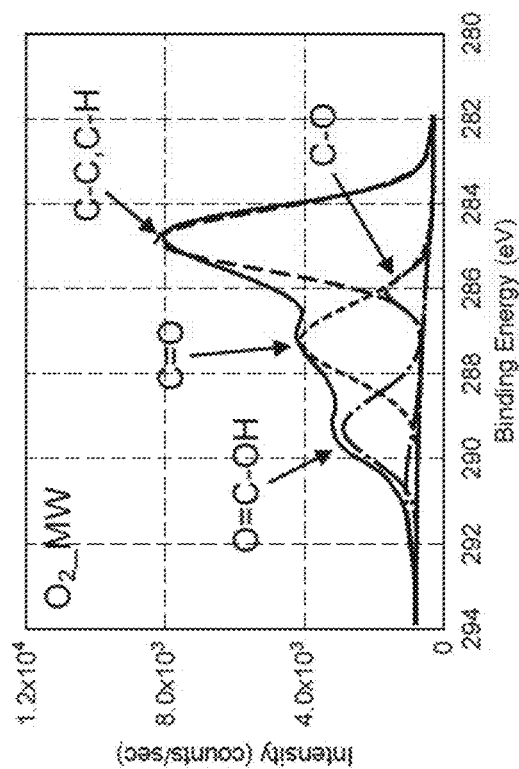
FIGS. 8A-8D A diagram showing XPS analysis results of a surface of an organic resin layer of an electronic component before etching treatment, after etching treatment, after oxygen ashing treatment with no application of radio-frequency bias, and after oxygen ashing treatment with application of radio-frequency bias.

FIG. 8A is an XPS analysis result of the surface of the organic resin layer (mask 42) on the semiconductor substrate after the laser processing (S101) is performed in accordance with the above-mentioned manufacturing method.

Figure 8B:
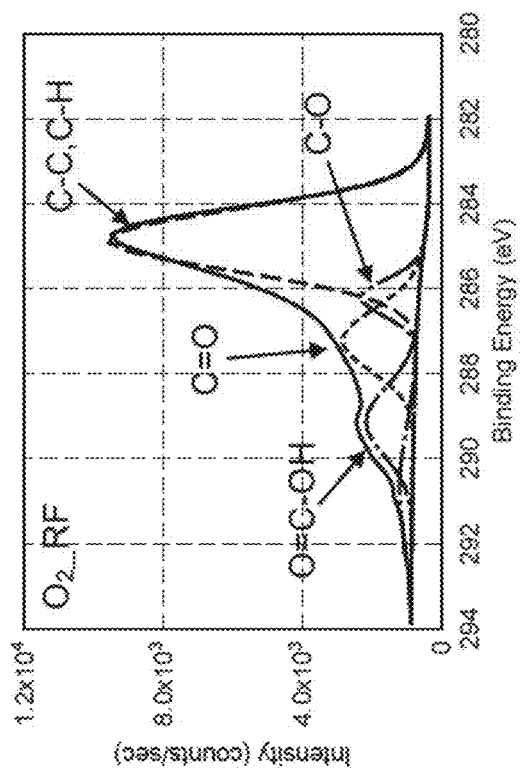

FIG. 8B is an XPS analysis result of the surface of the organic resin layer (mask 43) on the semiconductor substrate after the etching treatment (S102) using the mixed gas of $O_2/N_2/CF_4$ is performed in accordance with the above-mentioned manufacturing method.

Figure 8C:
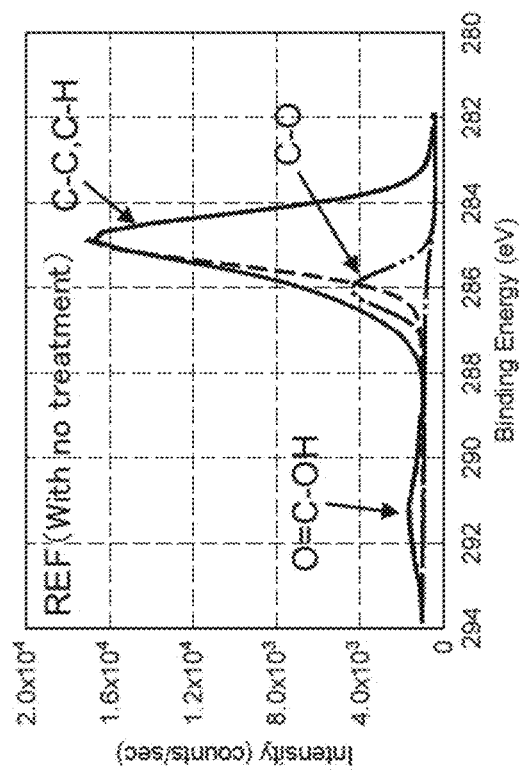

FIG. 8C is an XPS analysis result of the surface of the organic resin layer (mask 43) on the semiconductor substrate after the oxygen ashing treatment (S103) is performed in accordance with the above-mentioned manufacturing method. The oxygen ashing treatment is performed under a treatment condition that the RF bias is not applied.

Figure 8D:
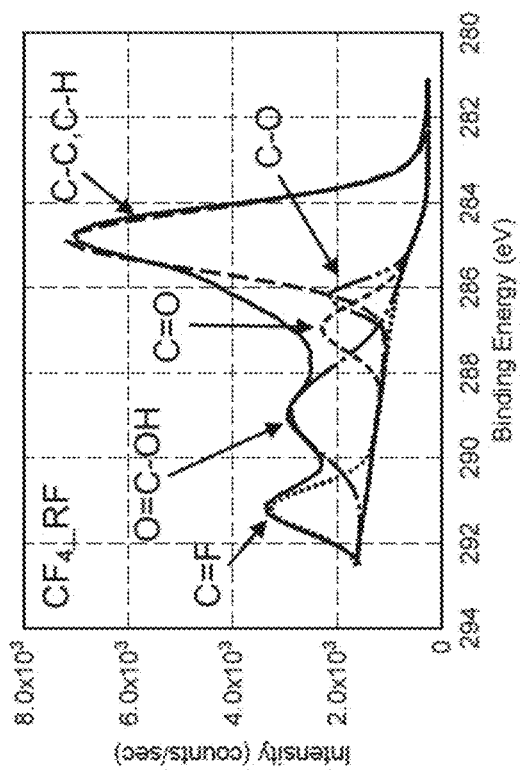

FIG. 8D is an XPS analysis result of the surface of the organic resin layer (mask 43) on the semiconductor substrate after the oxygen ashing treatment (S103) is performed substantially in accordance with the above-mentioned manufacturing method. It is different from the above-mentioned manufacturing method only in that the oxygen ashing treatment is performed under a treatment condition that the RF bias is applied.

In each diagram of FIGS. 8A-8D, the solid line indicates an XPS analysis result of the organic resin layer surface and the broken line and the dot-dash line indicate those obtained by performing waveform separation on the waveform of the organic resin layer surface shown as the solid line in a manner that depends on chemical bond states.

It was confirmed that fluoride and oxide were formed on the organic resin layer surface by etching treatment using the mixed gas of $O_2/N_2/CF_4$ as shown in FIGS. 8A-8B while the fluoride formed in the organic resin layer surface was removed when the oxygen ashing treatment was performed as shown in FIGS. 8C-8D. Further, as can be seen from the results of FIGS. 8C-8D, ratio of double bond (C=O) of carbon and oxygen to single bond (C—O) of carbon and oxygen was higher in the case where the RF bias was not applied in oxygen ashing treatment as compared to the case where the RF bias was applied. It is considered to be associated with a change in hydrophilicity over time to be described later.

Next, results of evaluating the contact angle of the organic resin layer surface, which depend on differences in power of the RF bias in oxygen ashing treatment, will be shown.

Figure 9:
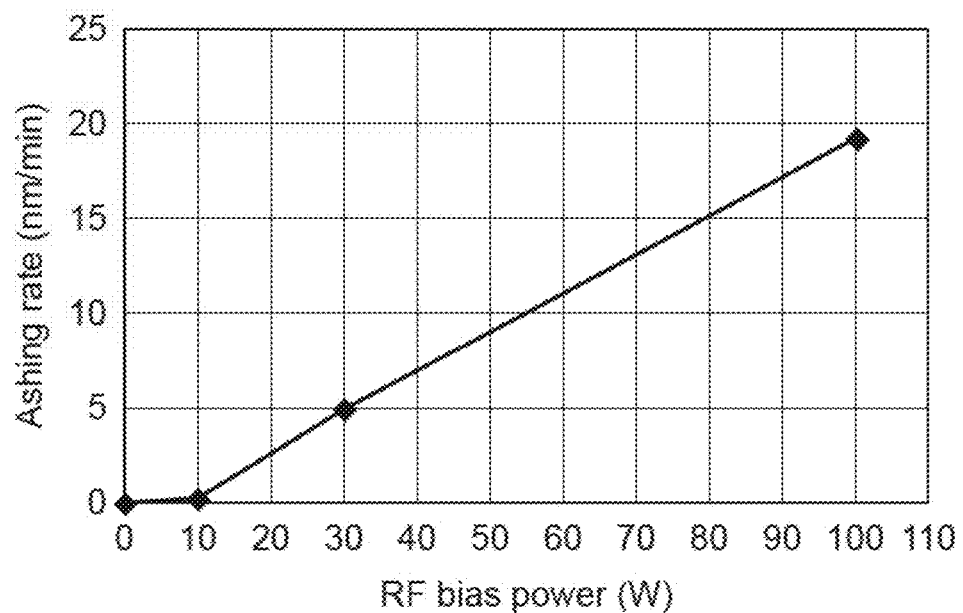
FIG. 9 A diagram showing a relationship between radio-frequency bias power and ashing rate in the oxygen ashing treatment.

FIG. 9 is a diagram showing a relationship between the power of the RF bias in oxygen ashing and an ashing amount of the resin layer per minute.

Figure 10:
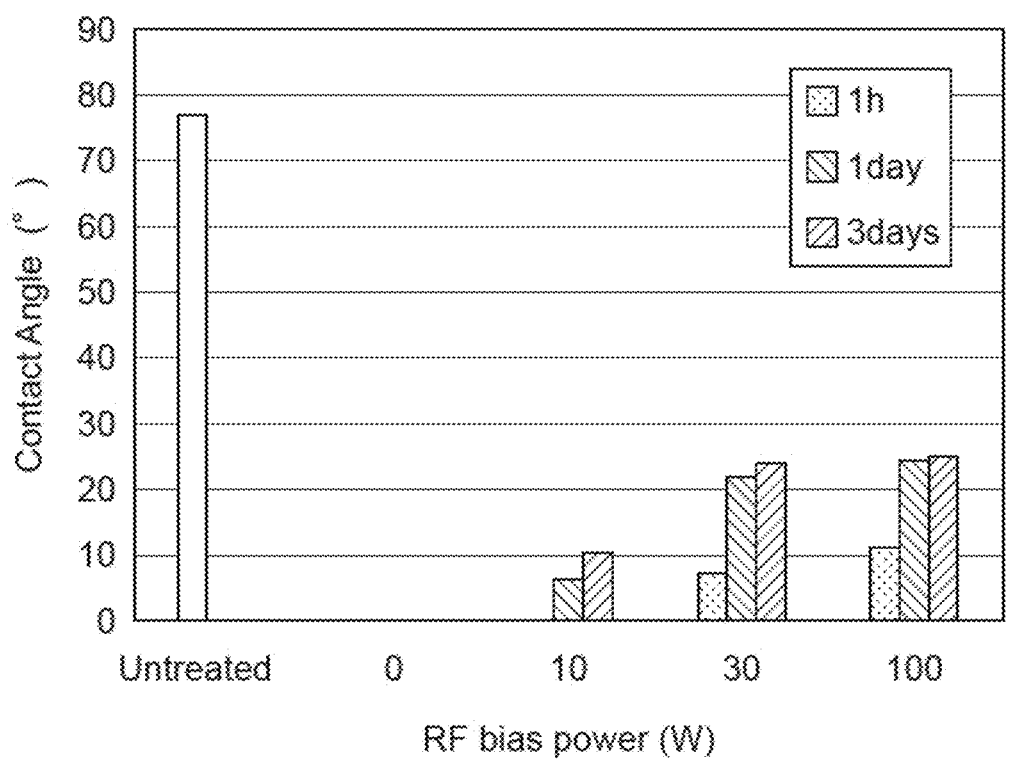
FIG. 10 A diagram showing a relationship between the radio-frequency bias power in the oxygen ashing treatment and changes in contact angle over time when an electroplating solution adheres to the surface of the organic resin layer.

FIG. 10 is a graph showing changes in contact angle over time of the organic resin layer surface, which depend on whether or not the oxygen ashing treatment is performed and on changes in power of the RF bias in the oxygen ashing treatment.

Also in both the diagrams, the semiconductor substrate after the etching treatment (S102) using the mixed gas of $O_2/N_2/CF_4$ was performed in accordance with the above-mentioned manufacturing method was prepared. Thereafter, the oxygen ashing treatment was performed by changing only the power of the RF bias in the oxygen ashing treatment and setting other oxygen ashing conditions to be similar to the manufacturing method of the above-mentioned oxygen ashing treatment (S103). The thus obtained semiconductor substrate was used as a sample.

As shown in FIG. 9, in a range of 0 to 10 W of the power of the RF bias, scraping of the organic resin layer was not confirmed. At 10 W or more, it was confirmed that the ashing rate, i.e., a scraping amount of the organic resin layer increases in proportion to the power of the RF bias.

FIG. 10 shows, in order from the left, the contact angles 1 in the oxygen ashing treatment one hour later, one day later, and three days later in each of the semiconductor substrate not subjected to oxygen ashing treatment (corresponding to untreated in the diagram), the semiconductor substrate subjected to oxygen ashing treatment under a condition that the RF bias was 0 W, i.e., the RF bias was not applied, the semiconductor substrate subjected to oxygen ashing treatment under a condition that the RF bias was 10 W, the semiconductor substrate subjected to oxygen ashing treatment under a condition that the RF bias was 30 W, and the semiconductor substrate subjected to oxygen ashing treatment under a condition that the RF bias was 100 W.

As shown in FIG. 10, with the semiconductor substrate not subjected to oxygen ashing treatment (sample untreated in the figure), it was confirmed that the contact angle when the electroplating solution adhered to the organic resin layer was about 78° and the surface of the organic resin layer exhibited hydrophobicity. Further, it was confirmed that the contact angles were smaller in any cases and hydrophilization treatment was achieved in the oxygen ashing treatment with the semiconductor substrate subjected to oxygen ashing treatment as compared to the semiconductor substrate not subjected to oxygen ashing treatment irrespective of whether or not the RF bias was applied. As described above, in the case where the oxygen ashing treatment is performed as compared to the case where the oxygen ashing treatment is not performed, the surface of the organic resin layer is hydrophilized and the electroplating solution favorably enters the hole in electroplating treatment.

Further, in the case where the RF bias was not applied in the oxygen ashing treatment, it was confirmed that the contact angles 1 in the oxygen ashing treatment one hour later, one day later, and three days later were all 0° and the effect of hydrophilicity was maintained. In the case where the RF bias was 10 W in the oxygen ashing treatment, the contact angle was 0° one hour later, was about 7° one day later, and was about 10° three days later after the oxygen ashing treatment. In the case where the RF bias was 30 W in the oxygen ashing treatment, the contact angle was about 7.5° one hour later, was about 21° one day later, and was about 23° three days later after the oxygen ashing treatment. In the case where the RF bias was 100 W in the oxygen ashing treatment, the contact angle was about 11° one hour later, was about 24° one day later, and was about 25° three days later after the oxygen ashing treatment.

Under the treatment condition of 0 to 10 W of the RF bias in the oxygen ashing treatment, there is no change in contact angle over time or the change in contact angle over time is smaller, and the effect of hydrophilicity is favorably maintained. With the semiconductor substrate subjected to oxygen ashing treatment under such a treatment condition, the effect of hydrophilicity is maintained even if there is a long time lag between the oxygen ashing treatment step and the subsequent electroplating treatment step. Therefore, the electroplating solution can favorably enter the hole in electroplating treatment. In particular, with the semiconductor substrate processed under a treatment condition that the RF bias is not applied, the contact angle is maintained at 0°, i.e., the effect of super-hydrophilicity is maintained even after a time elapsed. Further, the electroplating treatment step can be performed while the super-hydrophilicity is maintained even if there is a long time lag between the oxygen ashing treatment step and the electroplating treatment step. Thus, an electronic component which does not cause connection failures can be stably manufactured.

As described above, under the treatment condition that the power of the RF bias is small, for example, 0 to 10 W, the oxygen ashing treatment is performed by using oxygen plasma mainly including an oxygen radical. Under the treatment condition that the RF bias is 0 W, the treatment is performed by using substantially only oxygen radicals.

Further, from the results shown in FIG. 10, it was confirmed that the change in hydrophilicity over time is smaller in the case where the RF bias was not applied as compared to the case where the RF bias was applied in the oxygen ashing treatment. It is considered that, as described above in the description about FIGS. 8A-8D, the ratio of the double bond (C=O) of carbon and oxygen to the single bond (C—O) of carbon and oxygen is higher as a result in the case where the RF bias is not applied as compared to the case where the RF bias is applied in the oxygen ashing treatment, and thus one having the higher rate of double bond (C=O) of carbon and oxygen exhibits a smaller change in hydrophilicity over time.

In this embodiment, the hydrophilicity refers to a state when the contact angle when the electroplating solution adheres to the resin layer is 20° or less. The hydrophobicity refers to a state when the contact angle when the electroplating solution adheres to the resin layer is 20° or more. When the contact angle when the electroplating solution adheres to the resin layer is 20° or less, more favorably 5° or less, it can be said that the electroplating solution favorably enters the via-hole 5. The contact angles were determined by using a static sessile drop method. An angle formed by the resin layer surface and the drop when the drop of the electroplating solution is brought into contact with and adheres to the resin layer surface was defined as a contact angle. An image after drop adhesion was acquired. The contact angle was calculated by analyzing the image.

In order to cause the electroplating solution to favorably enter the via-hole at the electroplating solution treatment step, the power of the RF bias in the oxygen ashing treatment is favorably 0 to 30 W, more favorably 0 to 10 W, also considering changes in contact angle over time. The period for which the hydrophilization effect can be maintained can be prolonged by setting the power of the RF bias to be below 10 W. Thus, an electronic component which does not cause connection failures can be stably manufactured.

It should be noted that if the width of the recess portion (via-hole in the above-mentioned embodiment) in which the copper layer is embedded by electroplating treatment is narrower, for example, 200 µm or less or the depth is larger, for example, 10 to 30 µm, in the case where the oxygen ashing treatment is performed with no application of the RF bias, it is difficult for oxygen radicals to get into the bottom portion of the recess portion. In some cases, it is thus impossible to sufficiently perform hydrophilization treatment on the organic resin layer surface inside the recess portion. In those cases, it is desirable to apply the RF bias for oxygen radicals to enter the inside of the recess portion. The RF bias may be set to 10 to 30 W, for example, also for maintaining the hydrophilicity effect.

By setting the RF bias to 10 W or more, even if the hole for forming the via-hole has a small width or has a large depth, oxygen radicals enters the inside of the recess portion, and hydrophilization treatment of the resin layer surface inside the recess portion can be performed.

Further, by setting the RF bias to be below 10 W, the period for which the hydrophilization effect can be maintained can be prolonged. It should be noted that although the copper-via-hole formation has been described as an example in this embodiment, it can also be applied to copper-wire formation. In this case, the shape of the recess portion that the electroplating solution enters is a groove shape.

In the above-mentioned embodiment, the pressure is set to 70 Pa at the oxygen ashing treatment step, though not limited thereto. The treatment may be performed in a range of 10 to 100 Pa, for example. In that range, there were no effect differences in hydrophilization of the organic resin layer surface, and the hydrophilization effect was able to be sufficiently obtained. When the pressure is below 10 Pa, a sufficient amount of radicals generated is not obtained. When the pressure is above 100 Pa, an amount of radicals reaching the substrate can be reduced.

Further, the treatment time may be in a range of 3 seconds or more. When the treatment time is shorter than 3 seconds, sufficient hydrophilization treatment cannot be performed.

Further, the magnetron's power may be in a range of 500 to 1500 W. When the magnetron's power is lower than 500 W, sufficient hydrophilization treatment cannot be performed. The upper limit value depends on an upper limit value associated with the device configuration and is, for example, 1500 W.

Further, regarding the power of the RF bias, the effect of hydrophilization can be obtained by the oxygen ashing treatment irrespective of whether or not the RF bias is applied as described above. In addition, as the power of the RF bias becomes lower, the hydrophilicity effect can be more favorably maintained.

At the oxygen ashing treatment step, the substrate stage temperature was set to 25° C. in the above-mentioned embodiment, though not limited thereto.

Figure 11:
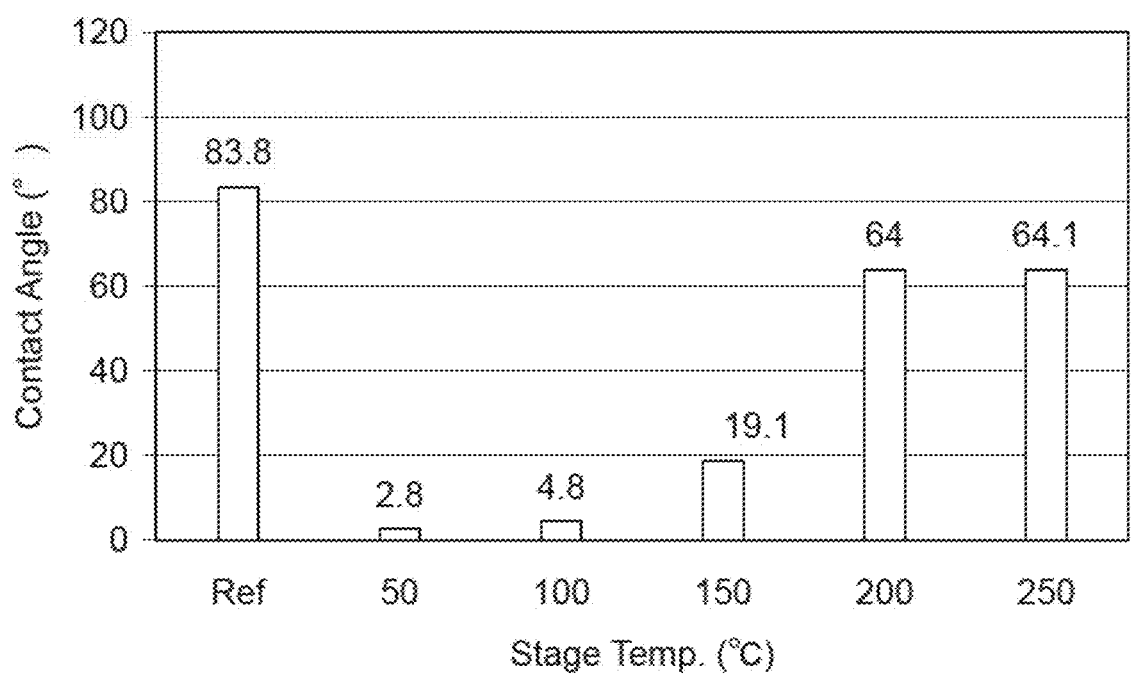
FIG. 11 A diagram showing a relationship between a substrate stage temperature in the oxygen ashing treatment and changes in contact angle over time when the electroplating solution adheres to the surface of the organic resin layer.

FIG. 11 is a diagram showing a contact angle when the electroplating solution adheres to the organic resin layer in a semiconductor substrate subjected to oxygen ashing under the same treatment condition except for the substrate stage temperature.

In FIG. 11, the semiconductor substrate after the etching treatment (S102) using the mixed gas of $O_2/N_2/CF_4$ is performed in accordance with the above-mentioned manufacturing method was prepared. The oxygen ashing treatment was performed by changing only the substrate stage temperature in the oxygen ashing treatment and setting other oxygen ashing conditions to be similar to the manufacturing method of the above-mentioned oxygen ashing treatment (S103). The thus obtained semiconductor substrate was used as a sample. It should be noted that in the sample in FIG. 11, an i-line photoresist "SPR3012" manufactured by the Dow Chemical Company, not PBO, was used for the material of the organic resin layer.

FIG. 11 shows, in order from the left, the surface of the contact angle when the electroplating solution adhered to the organic resin layer in each of the semiconductor substrate not subjected to oxygen ashing treatment, the semiconductor substrate subjected to treatment under a condition that the substrate stage temperature in the oxygen ashing treatment was 50° C., the semiconductor substrate subjected to treatment under a condition of 100° C., the semiconductor substrate subjected to treatment under a condition of 150° C., the semiconductor substrate subjected to treatment under a condition of 200° C., and the semiconductor substrate subjected to treatment under a condition of 250° C.

As shown in FIG. 11, it was confirmed that irrespective of the substrate stage temperature, the contact angle was smaller in the case where the oxygen ashing treatment was performed as compared to the case where the oxygen ashing treatment was not performed. Further, it was confirmed that the contact angle was below 20° when the substrate stage temperature was 150° C. or less, the contact angle became much smaller, below 5° when the substrate stage temperature was 100° C. or less, and the contact angle became still much smaller, below 3° C. when the substrate stage temperature was 50° C. or less. As described above, as the treatment temperature in the oxygen ashing treatment becomes lower, an organic resin layer having a smaller contact angle can be obtained.

At the oxygen ashing treatment step, it is desirable to set the substrate stage temperature to 25 to 150° C. With such a temperature condition, the hydrophilization treatment of the organic resin layer can be sufficiently performed, and the electroplating solution can favorably enter the via-hole at the electroplating treatment step which is the subsequent step. When the substrate stage temperature is below 150° C., C (carbon) and O (oxygen) are bonded due to exposure to oxygen radicals. When the substrate stage temperature is above 150° C., the contact angle becomes larger, a sufficient hydrophilization effect cannot be obtained. Further, in the case where the target object to be processed is a substrate including a chip, treatment at 150° or less is favorable for maintaining the quality of the chip.

As described above, in the present invention, the surface of the organic resin layer can be hydrophilized by performing oxygen ashing treatment after etching treatment using the reactant gas including fluorine. Thus, the electroplating solution can favorably enter the via-hole at the subsequent electroplating treatment step. With this, an electronic component having no wiring defect can be obtained.

Hereinabove, the embodiment of the present invention has been described. However, the present invention is not limited only to the above-mentioned embodiment, and various modifications can be added without departing from the gist of the present invention as a matter of course. In the above-mentioned embodiment, the copper-via-hole forming step in the re-distribution layer has been described as an example, though not limited thereto. It can be applied to a case where an organic resin layer surface exhibits hydrophobicity due to plasma treatment using a reactant gas including fluorine at a step preceding an electroplating treatment step in a manufacturing method in which a third metal layer is formed by electroplating inside a recess portion formed in an organic resin layer by using the organic resin layer as a mask.

REFERENCE SIGNS LIST

1 semiconductor substrate (substrate)
2 copper layer (first metal layer)
3 titanium layer (second metal layer)
4 organic resin layer (organic resin layer before first recess portion is formed)
5 via-hole (second recess portion)
6 copper layer for via-hole (third metal layer)
20 substrate stage
41 first recess portion
42 mask

The invention claimed is:

1. A manufacturing method for an electronic component, comprising:

forming a first metal layer on a substrate;
forming a second metal layer on the first metal layer;
forming a mask made of an organic resin layer on the second metal layer;
performing plasma etching on the second metal layer by using a reactant gas including fluorine via the mask to thereby form a recess portion in a layered film of the organic resin layer and the second metal layer;
performing oxygen ashing treatment on an inner surface of the recess portion; and
forming a third metal layer in the recess portion by electroplating treatment after the oxygen ashing treatment.

2. The manufacturing method for an electronic component according to claim 1, wherein
the second metal layer includes titanium.

3. The manufacturing method for an electronic component according to claim 1, wherein
the etching step is performed by using a mixed gas of oxygen, nitrogen, and tetrafluoromethane as the reactant gas.

4. The manufacturing method for an electronic component according to claim 1, wherein
the oxygen ashing treatment step is performed by using oxygen plasma mainly including an oxygen radical.

* * * * *